US012787480B2

(12) United States Patent
Lin et al.

(10) Patent No.: US 12,787,480 B2
(45) Date of Patent: Nov. 3, 2026

(54) OPTICAL SENSING DEVICE

(71) Applicant: Taiwan-Asia Semiconductor Corporation, Hsinchu City (TW)

(72) Inventors: Edgar Lin, Hsinchu City (TW); Jia-En Wu, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 336 days.

(21) Appl. No.: 18/667,739

(22) Filed: May 17, 2024

(65) Prior Publication Data

US 2025/0098361 A1 Mar. 20, 2025

(30) Foreign Application Priority Data

Sep. 19, 2023 (TW) ................................ 112135666

(51) Int. Cl.
*H10F 77/14* (2025.01)
*H10F 30/22* (2025.01)
*H10F 77/30* (2025.01)

(52) U.S. Cl.
CPC ........... *H10F 77/147* (2025.01); *H10F 30/22* (2025.01); *H10F 77/331* (2025.01)

(58) Field of Classification Search
CPC ...... H10F 77/147; H10F 30/22; H10F 77/331; H10F 30/221
See application file for complete search history.

(56) References Cited

U.S. PATENT DOCUMENTS

| | | | | |
|---|---|---|---|---|
| 2004/0026604 | A1 | 2/2004 | Nishikawa et al. | |
| 2009/0200580 | A1 * | 8/2009 | Rhodes | H10F 39/014 257/233 |
| 2021/0020802 | A1 * | 1/2021 | Zhou | H10F 10/10 |
| 2023/0103445 | A1 | 4/2023 | Lee et al. | |

FOREIGN PATENT DOCUMENTS

| | | | |
|---|---|---|---|
| JP | 2001028454 | A | 1/2001 |
| JP | 2002033503 | A | 1/2002 |
| JP | 2019521376 | A | 7/2019 |
| TW | 452853 | B | 9/2009 |
| TW | 200945567 | A | 11/2009 |
| TW | I528533 | | 4/2016 |

* cited by examiner

*Primary Examiner* — Marlon T Fletcher
*Assistant Examiner* — Samuel Jonathan Smith
(74) *Attorney, Agent, or Firm* — Muncy, Geissler, Olds & Lowe, P.C.

(57) ABSTRACT

A optical sensing device includes a substrate, an optical acting area and a filter layer. The optical acting area is disposed on the substrate. The filter layer covers the optical acting area and selectively allows only a light beam with a specific wavelength to pass through and be received by the optical acting area while blocking the light beams with other wavelengths. Each of the two sides of the substrate has a bevel structure. The filter layer covers each bevel structure of each side to prevent the light beams with other wavelengths from passing through the two sides of the substrate being received by the optical acting area.

11 Claims, 1 Drawing Sheet

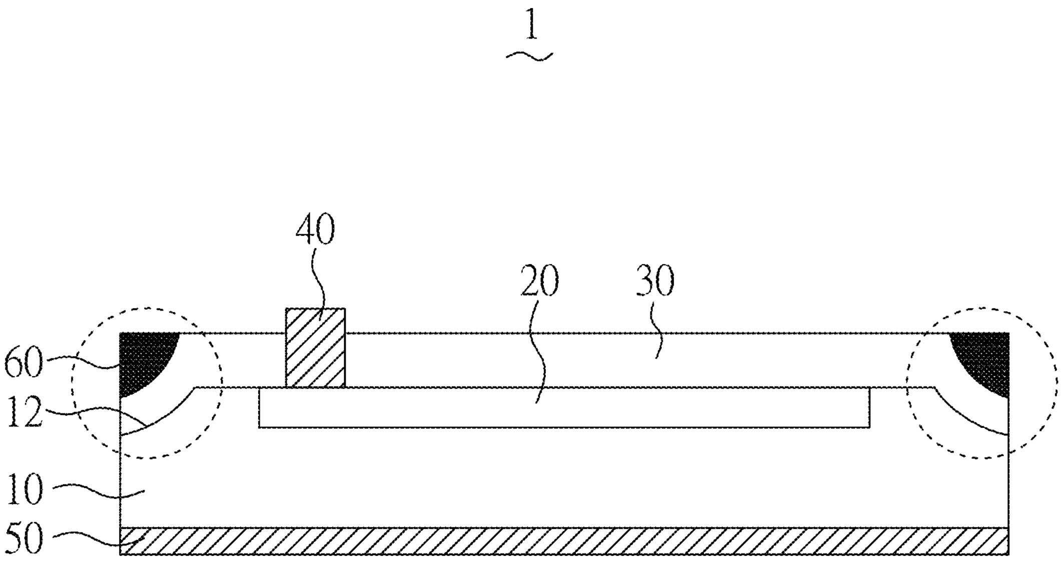
1
40
20
30
60
12
10
50

OPTICAL SENSING DEVICE

CROSS-REFERENCES TO RELATED APPLICATIONS

This application claims the benefit of priority to Taiwanese Patent Application No. 112135666 filed on Sep. 19, 2023, which is hereby incorporated by reference in its entirety.

BACKGROUND OF THE INVENTION

Field of the Invention

The present invention relates to an optical sensing device, in particular to an optical sensing device having side bevel structure.

Descriptions of the Related Art

The band pass filter (BPF) is an optical component used to selectively allow a light beam with a specific wavelength to pass through while to block the light beams with other wavelengths. This kind of filter is useful in optical sensing devices because it can be used to separate and detect the wavelength or the frequency of specific light beams in a certain area, and is therefore applied in some technical fields such as biomedical imaging and environmental monitoring.

The working principle of an optical bandpass filter is based on the interference and reflection of light. Typically, the bandpass filter comprises a transparent substrate and a multilayer thin-film structure. These thin-film layers are alternately stacked in different materials, with specific optical thicknesses to achieve high transmittance for a particular wavelength and high reflectance for other wavelengths. When light illuminates the surface of the filter, it enters the multilayer thin-film structure of the filter, and interference and reflection of light will be occurred at the interfaces among the multilayer thin-film structure. Due to the different speeds of propagation for light with different wavelengths in different materials, the interference among the multilayer thin-film structure will result in the phase addition and enhancement for light with certain wavelength light, while the phase cancellation and weakening for light with other wavelengths. Through proper design, the multilayer thin-film structure of the filter can form a resonant cavity, allowing light with a specific wavelength to be enhanced, while light with other wavelengths is reflected or absorbed. Thus, light beams with a specific wavelength are able to pass through the filter, and create the so-called "bandpass" effect.

Although traditional sensing devices use bandpass filters to filter light with specific wavelengths, however, in actual applications, some light will still enter the interior of the sensing device and generate photocurrent at the photodiode interface. The detection accuracy will be affected. In order to overcome the above problems, the industry urgently needs an innovative light sensing structure to improve the above problems of poor filtering.

SUMMARY OF THE INVENTION

One main objective of the present invention is to provide an innovative optical sensing device to overcome the conventional problems such as erroneous signals caused by poor filtering and poor detection accuracy.

To achieve the above objective, the present invention provides an optical sensing device comprising a substrate, an optical acting area and a filter layer. The optical acting area is disposed on the substrate. The filter layer covers the optical acting area and selectively allows only a light beam with a specific wavelength to pass through and be received by the optical acting area while blocking the light beams with other wavelengths. Each of the two sides of the substrate has a bevel structure. The filter layer covers each bevel structure of each side to prevent the light beams with other wavelengths from passing through the two sides of the substrate being received by the optical acting area.

In one embodiment of the optical sensing device of the present invention, the filter layer is a band pass filter.

In one embodiment of the optical sensing device of the present invention, the band pass filter is a composite layer of $Ta_2O_5$ and $SiO_2$.

In one embodiment of the optical sensing device of the present invention, the depth of the bevel structure is smaller than ¼ of the thickness of the substrate.

In one embodiment of the optical sensing device of the present invention, the depth of the bevel structure is approximately 40 μm.

In one embodiment of the optical sensing device of the present invention, the optical sensing device further comprises a mask layer partially covering the filter layer on each of the bevel structure.

In one embodiment of the optical sensing device of the present invention, the material of the mask layer contains color photoresist.

In one embodiment of the optical sensing device of the present invention, the material of the mask layer is selected from a group consisting of aluminum, titanium, copper, silver, gold and the alloy combination thereof.

In one embodiment of the optical sensing device of the present invention, the light beam with the specific wavelength is the ultraviolet light beam with the wavelength ranging from about 100 nm to 400 nm.

In one embodiment of the optical sensing device of the present invention, the optical acting area comprises a silicon photodiode structure.

In one embodiment of the optical sensing device of the present invention, the substrate is a silicon substrate.

After reviewing the diagrams and subsequent descriptions, those skilled in the art will readily understand other objectives of the present invention, as well as the technical means and embodiments of the present invention.

BRIEF DESCRIPTION OF THE DRAWINGS

The figure is a schematic structural diagram of an optical sensing device in an embodiment of the present invention.

DETAILED DESCRIPTION OF THE PREFERRED EMBODIMENT

The content of the present invention will be explained through examples below. The examples of the present invention are not intended to limit the implementation of the present invention to any specific environment, application, or particular manner as described in the examples. Therefore, the description of the examples is only to elucidate the purpose of the present invention, and not to limit the present invention. It should be noted that in the following examples and the figure, components not directly related to the present invention have been omitted and not shown. The dimensional relationships between the components in the figure are provided for ease of understanding and are not intended to limit the actual proportions.

Please refer to the figure, which illustrates a schematic diagram of the structure of the optical sensing device in an exemplary embodiment of the present invention. As shown in the diagram, the optical sensing device 1 in this embodiment comprises a substrate 10, an optical acting area 20, a filter layer 30, an upper electrode 40, and a lower electrode 50. The substrate 10 serves as the supporting material in the bottom of the optical sensing device 1. Typically, the substrate is made of optically transparent materials to allow the passage of light. The material for the substrate 10 is often chosen to have good light transmittance, such as silicon, quartz, and the like. In the present embodiment of the invention, silicon is used as the material for substrate 10. The thickness of the substrate 10 can vary based on specific application needs and design requirements, typically ranging from several hundred micrometers (μm) to several millimeters (mm). In this embodiment of the present invention, the thickness of the silicon substrate 10 is approximately 400 micrometers.

Continuing with the figure, the optical acting area 20 is disposed in the central region on the substrate 10, serving as the part for detecting light signals. It is typically a P/N photodiode structure designed to receive light beams with specific wavelengths. Specifically, the optical acting area 20 in the present invention includes a silicon photodiode structure. Next, the filter layer 30 is a bandpass filter layer covering the optical acting area 20. The filter layer 30 selectively allows only light beams with a specific wavelength to pass through and be received by the optical acting area 20 while blocking light beams with other wavelengths. In one embodiment of the present invention, the filter layer 30 only allows ultraviolet light in the wavelength range of approximately 100 nm to 400 nm to pass through and blocks light beams with other wavelengths, such as visible light and far-infrared light, to prevent them from being absorbed by the optical acting area 20. The filter layer 30 is a multi-layer thin-film structure. In this embodiment of the present invention, the filter layer 30 is a composite layer of tantalum pentoxide ($Ta_2O_5$) and silicon dioxide ($SiO_2$). The upper electrode 40 is disposed within the filter layer 30, and the lower electrode 50 is disposed on the backside of the substrate 10. The electrodes are used to apply an electric field to control the optical characteristics of the filter layer 30. By changing the voltage and thus modifying the refractive index of the dielectric layer in the filter layer structure, the main wavelengths or bandwidths of the light beams to be filtered out by the filter can be adjusted.

A distinctive feature of the optical sensing device 1 in the present invention is to reduce interference from side light beams. To achieve this purpose, bevel structures 12 are respectively set on both sides of the substrate 10, as shown in the dashed area in the figure. In specific applications, these bevel structures 12 are formed on the substrate 10 through an isotropic etching process. The depth of the bevel structure 12 on the substrate 10 is typically less than ¼ of that of the substrate 10. Specifically, when the thickness of the substrate 10 is approximately 400 micrometers, the depth of the bevel structure 12 on the substrate ranges from 0 to 100 micrometers. In a preferred embodiment of the present invention, the depth of the bevel structure 12 on the substrate can be 40 micrometers.

Continuing with the figure, as shown in the diagram, the filter layer 30 covers the entire substrate 10 and the optical acting area 20. Therefore, the filter layer 30 also conformally covers each bevel structure 12 on both sides of the substrate 10. Due to the beveled contour of the bevel structures 12, the two sides of the filter layer 30 have a similar downward-sloping beveled profile compared to the central region. Consequently, the downward-sloping portions of the filter layer 30 effectively prevent external light beams, other than light beams with a specific wavelength, for example, external light beams except for ultraviolet light, from entering the interior through the sidewalls of the substrate. This prevents erroneous signals from being generated by light beams with wavelengths other than the specific wavelength, ensuring the accuracy of the detection in the optical acting area.

In order to further reduce interference from side light beams, the optical sensing device 1 of the present invention includes an additional mask layer 60 covering a portion of the filter layer 30 on each bevel structure 12. The material of the mask layer 60 may include color photoresist or metallic materials to further block external light interference on the sidewalls of the substrate. The color photoresist in the mask layer 60 can be materials such as, but not limited to, zinc sulfide (ZnS), cadmium selenide (CdSe). On the other hand, the metallic material in the mask layer 60 can be formed on a portion of the filter layer 30 on each bevel structure 12 through sputtering or physical vapor deposition. The metallic material can be selected from a group consisting of aluminum, titanium, copper, silver, gold, and the alloy combination thereof.

In summary, the optical sensing device of the present invention achieves enhances accuracy in light detection by forming bevel structures through etching at the edges of the device. The surface of the device is then covered with a filter layer and a mask layer serving as shielding materials to further block external light from entering the interior through the sidewalls of the device and causing erroneous signals.

The above embodiments are provided for illustrative purposes and to explain the technical features of the present invention, and are not intended to limit the scope of protection of the present invention. Any modifications or equivalents that can be easily made by those skilled in the art are within the scope claimed by the present invention, and the scope of protection of the present invention shall be determined by the scope of the Patent Application.

What is claimed is:

1. An optical sensing device, comprising:

a substrate;

an optical acting area, disposed on the substrate; and a filter layer, covering the optical acting area and selectively allowing only a light beam with a specific wavelength to pass through and to be received by the optical acting area while blocking light beams with other wavelengths, wherein each of the two sides of the substrate has a bevel structure, the filter layer covers each of the bevel structure of the two sides to prevent the light beams with other wavelengths from passing through the two sides of the substrate being received by the optical acting area.

2. The optical sensing device of claim 1, wherein the filter layer is a band pass filter.

3. The optical sensing device of claim 2, wherein the band pass filter is a composite layer of $Ta_2O_5$ and $SiO_2$.

4. The optical sensing device of claim 1, wherein the depth of the bevel structure is smaller than ¼ of the thickness of the substrate.

5. The optical sensing device of claim 4, wherein the depth of the bevel structure is approximately 40 μm.

6. The optical sensing device of claim 1, further comprising a mask layer partially covering the filter layer on each of the bevel structure.

7. The optical sensing device of claim 6, wherein the material of the mask layer containing color photoresist.

8. The optical sensing device of claim 6, wherein the material of the mask layer is selected from a group consisting of aluminum, titanium, copper, silver, gold and an alloy combination thereof.

9. The optical sensing device of claim 1, wherein the light beam with the specific wavelength is the ultraviolet light beam with the wavelength ranging from about 100 nm to 400 nm.

10. The optical sensing device of claim 1, wherein the optical acting area comprises a silicon photodiode structure.

11. The optical sensing device of claim 1, wherein the substrate is a silicon substrate.

* * * * *